(12) United States Patent
Gruenewald et al.

(10) Patent No.: US 7,299,098 B2
(45) Date of Patent: Nov. 20, 2007

(54) METHOD AND DEVICE FOR PROGRAMMING A CONTROL UNIT

(75) Inventors: Martin Gruenewald, Brakenheim (DE); Axel Aue, Korntal-Muenchingen (DE)

(73) Assignee: Robert Bosch GmbH, Stuggart (DE)

( * ) Notice: Subject to any disclaimer, the term of this patent is extended or adjusted under 35 U.S.C. 154(b) by 978 days.

(21) Appl. No.: 10/283,595

(22) Filed: Oct. 30, 2002

(65) Prior Publication Data
US 2003/0100980 A1    May 29, 2003

(30) Foreign Application Priority Data
Oct. 30, 2001    (DE) ................. 101 53 085

(51) Int. Cl.
*G05B 11/01* (2006.01)
*G06F 3/00* (2006.01)
(52) U.S. Cl. ................. 700/18; 710/14; 710/5
(58) Field of Classification Search ............ 700/18, 700/23, 86, 26; 710/14, 5; 709/223, 224
See application file for complete search history.

(56) References Cited

U.S. PATENT DOCUMENTS

| | | | |
|---|---|---|---|
| 4,977,394 A * | 12/1990 | Manson et al. ............. 340/679 |
| 6,502,265 B2 * | 1/2003 | Blair et al. ................... 8/159 |
| 6,760,688 B2 * | 7/2004 | Suzuki et al. ............... 702/188 |
| 6,912,428 B2 * | 6/2005 | Nakai et al. .................. 700/18 |
| 2002/0128729 A1 * | 9/2002 | Blair et al. ................... 700/19 |
| 2002/0161488 A1 * | 10/2002 | Guillemin et al. ............. 701/3 |

FOREIGN PATENT DOCUMENTS

DE        43 32 499        3/1995

* cited by examiner

*Primary Examiner*—Thomas K. Pham
(74) *Attorney, Agent, or Firm*—Kenyon & Kenyon LLP

(57) ABSTRACT

In a device and method for programming a control unit, the control unit is connectable to an external programming unit via a communications interface, an internal communications link connecting the communications interface to a monitoring unit, and the monitoring unit having a programming element and a communications element, a switching arrangement being provided for switching the communications link between the programming element and the communications element.

9 Claims, 1 Drawing Sheet

METHOD AND DEVICE FOR PROGRAMMING A CONTROL UNIT

CROSS-REFERENCE TO RELATED APPLICATIONS

The present application claims priority to Application No. 101 53 085.4, filed on Oct. 30, 2001 in the Federal Republic of Germany, which is expressly incorporated herein in its entirety by reference thereto.

FIELD OF THE INVENTION

The present invention relates to a method and a device for programming a control unit, the control unit being connectable to an external programming unit via a communications interface as well as a switching arrangement having terminals for connection to a communications link.

BACKGROUND INFORMATION

Because of their increasing number of functions, modern controllers and control units, in particular those in a vehicle, for example engine controllers, transmission controllers, brake controllers, etc., need ever larger memory elements, in particular flash memories, for programs and data. These memories need to be programmed during manufacturing in the factory as well as undergo end-of-line programming by vehicle manufacturers and possibly also programming in repair shops in the field. The data to be programmed is usually transmitted to the controller via a serial interface that is otherwise used to transmit diagnostic information.

For this purpose, German Published Patent Application No. 43 32 499 describes a method for programming a memory in a control unit. According to this method, the data to be programmed is transmitted from an external electronic device, for example a personal computer, to the control unit. The serial interface used to transmit the data to be programmed is the existing serial diagnostic interface connecting the external electronic device to the control unit. The limited transmission rates achievable in this case, a maximum of 250 kbaud, result in ever longer transmission times, for example around 320 seconds for 8 MB.

It is an object of the present invention to shorten transmission times during programming while keeping costs low.

In recent years, the practice of networking controllers, sensors, and actuators using a communications system or bus system has increased dramatically in the manufacture of modern motor vehicles as well as the construction of machines, particularly in the machine-tool segment and in automation. It is therefore possible to utilize synergy effects by distributing functions among multiple controllers. This arrangement involves distributed systems or a controller network. Communication between different stations increasingly takes place via a bus or a bus system. Communications traffic on the bus system—access and receiving mechanisms—are controlled by a protocol.

A protocol that has been widely accepted in automotive applications is CAN (controller area network). It is an event-controlled protocol, i.e., protocol activities such as transmitting messages are initiated by events originating outside the communications system. Clear access to the communications system, i.e., bus system, is triggered by priority-based bit arbitration. To do this, each message must be assigned a clear priority. The CAN protocol is extremely flexible in that it allows additional nodes and messages to be added without problems.

SUMMARY

The above and other beneficial objects of the present invention are achieved by providing a method, a device and a switching arrangement as described herein.

To achieve shortened transmission times during programming while keeping costs low, a device and a method for programming a control unit are described, the control unit being connectable to an external programming unit via a communications interface, an internal communications link connecting the communications interface to a control unit, and the control unit having a programming element and a communications element.

A switching arrangement may be provided and used to switch the communications link between the programming element and the communications element so that both programming and communication of the control unit occur via the same communications interface.

Today's controllers, in particular engine controllers, have at least one bus interface for communicating with other control units or sensors and/or actuators. The CAN (controller area network) bus serves as an example of a bus interface of this type, i.e., a corresponding communications link. When programming the memory, in particular the flash memory, a CAN link may be used, according to the present invention, for programming instead of for its actual purpose of communication.

A CAN system of this type in the control unit includes a communications link, i.e., the CAN transmission lines, a communications element, i.e., the CAN controller, a communications interface from the control unit to the outside and a driver block or driver element, i.e., a CAN driver in the special situation of a controller area network. However, only the CAN interface driver included in the control unit, the corresponding CAN line, i.e., the communications link, and the external CAN communications interface are used for programming.

The exemplary use of a CAN bus system as a communications system of the control unit should not be viewed as a restriction in the context of the present invention. According to the present invention, a different bus system, for example a TTCAN or other system, may be used for controller communication and thus for achieving the object of the present invention.

A switching arrangement that switches between the communications element and a programming element, for example, a serial interface chip, is provided in the communications link. In this case, the data is suitably transmitted via the communications link in communications mode, using a first protocol—a communications protocol, in particular a CAN protocol—while a second bus protocol, in particular an ordinary standard protocol of a serial interface, is used for programming after the switching arrangement has switched the communications link to the programming element.

The control unit includes a monitoring unit or processing unit, in particular a microprocessor, which includes the programming element and the communications element, the monitoring unit being suitably configured so that internal program-based reconfiguration operations at the terminals of its internal communications element, in particular the CAN controller, may be used to optionally switch to the terminals of its internal programming element, in particular the internal serial interface.

In addition to the programming element and the communications element, the switching arrangement may also be integrated into the monitoring unit according to an exemplary embodiment.

The communications link, communications interface, and driver element provided in the control unit for communication between the control unit and the vehicle controller network may thus be simultaneously used for programming the control unit, thereby avoiding the added expense of providing additional components.

The serial interface unit, i.e., the programming element, is generally included in the monitoring unit, once again avoiding added costs. The internal switching arrangement, for example, a multiplexer for switching the interfaces, is implemented in a manner that may only slightly increase the complexity of the functional range of the monitoring unit, i.e., the microprocessor chip, so that almost no additional expense is incurred. This may achieve a very simple, economical capability, which supports a much higher transmission rate and thus significantly shortens transmission times when programming the control units.

Significant advantages, particularly in relation to the transmission rate and the shorter transmission times, may also be achieved by having an external switching arrangement perform the switching operation outside the monitoring unit.

DETAILED DESCRIPTION

Figure 1:
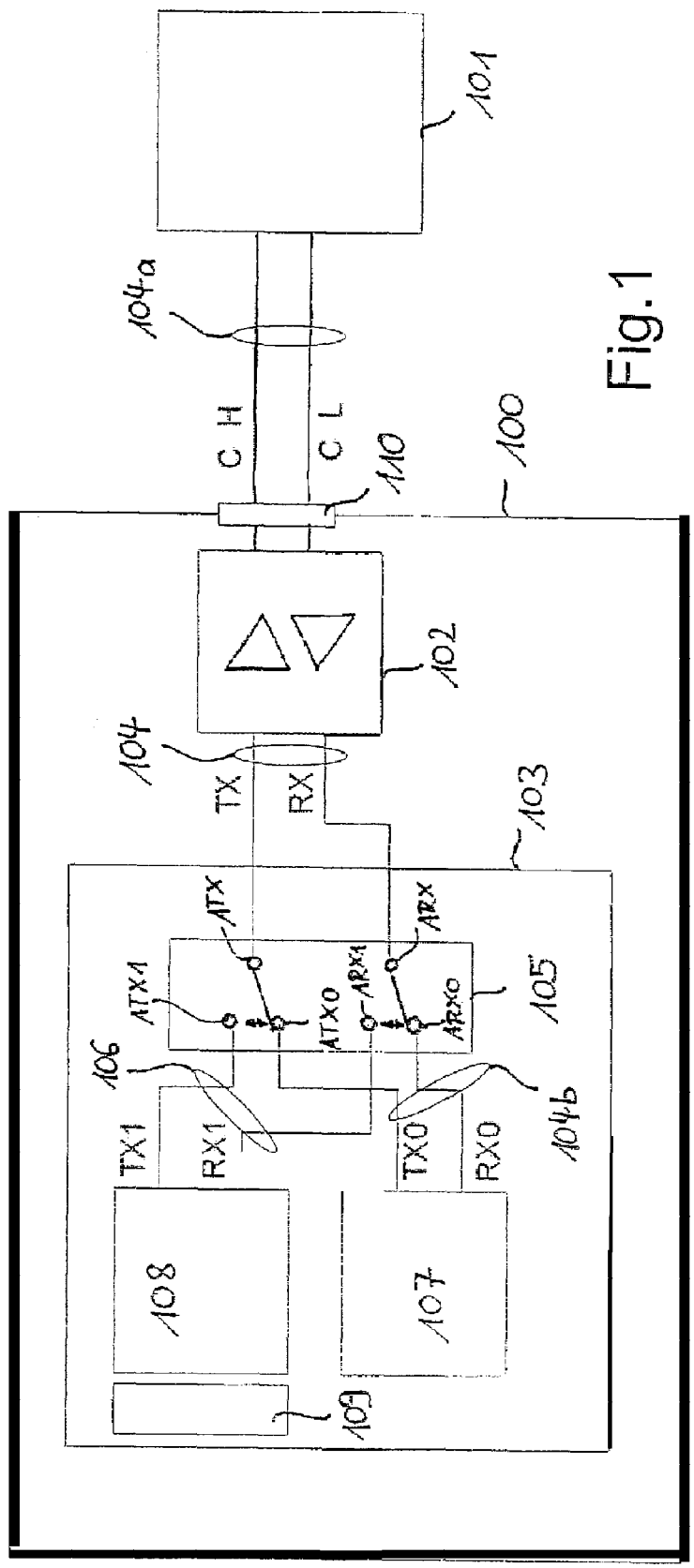
FIG. 1 is a schematic view of a controller, in particular in a vehicle, which includes a CAN communications link along with all the necessary components and elements, and also a switching arrangement for switching to a programming element.

Because practically all modern engine controllers today have one or more CAN interfaces, they may be used, contrary to their actual purpose, to transmit data during flash programming. However, only a CAN interface driver included in the controller and the corresponding external lines are used for this purpose. The microprocessor used in the controller is configured so that a processor-internal, program-based reconfiguration operation at the input/output pins, i.e., terminals, of an internal CAN controller may also be used to optionally switch the input/output pins, i.e., terminals, of an internal serial interface.

Important advantages (with the exception of the general cost neutrality) are also achieved by using additional switching elements for switching outside the microprocessor.

For this purpose, FIG. 1 illustrates a controller, i.e., a control unit 100, and a programming device, i.e., a programming unit 101. The controller has an external communications interface 110 that internally connects a communications link 104 to lines TX and RX. A driver element, in particular a CAN driver 102 that makes it possible to connect to communications interface 110 bidirectionally and at a required level is connected in this communications link 104, i.e., the two lines TX and RX. The external lines, i.e., external communications link 104a, are identified by CH and CL for the CAN example, i.e., CAN High and CAN Low. Programming device 101 is connectable to control unit 100 via this external communications link 104a.

Control unit 100, i.e., the controller, includes a monitoring unit 103, in particular a microprocessor, microcomputer, or similar device, etc. The latter includes a communications unit, i.e., a communications element 107, which in this example corresponds to a CAN controller. Microprocessor 103 also includes a programming element 108, in particular a serial interface chip (e.g., an asynchronous serial communications interface, ASC) to transmit and receive data for programming memory 109, which is, in particular, also integrated into the microprocessor. The memory may also be located outside monitoring unit 103 and may be configured as a flash memory.

According to the present invention, a switching arrangement 105, in particular a program-controlled interface switch or even a multiplexer, is provided for switching the communications link from communications element 107 to programming element 108. An interface switch of this type may be provided inside or outside the microprocessor, i.e., monitoring unit 103.

For this purpose, communications element 107 is connected to switching arrangement 105 via a link section 104b. Lines TX0 and RX0 of 104b are connected to terminals ATX0 and ARX0. Programming chip 108 is also connected to switching arrangement 105 via a link section 106. For this purpose, lines TX1 and RX1 of 106 are connected to terminals ATX1 and ARX1. In the direction of driver element 102, lines TX and RX of communications link 104 are contacted to switching arrangement 105 via terminals ATX and ARX.

During normal communication, in particular in the vehicle controller network, the link is established from CAN controller 107 via communications link section 104b, interface switch 105 and communications link 104 to CAN driver 102 and CAN interface 110, and data is transmitted as usual by CAN communication. As a result, a first bus protocol, in particular the CAN bus protocol, is used in this case.

To program the control unit, control unit 100 is connected to programming device 101 via 104a. Interface switch 105 then contacts the link to element 108 via link section 106. Communications interface 110, CAN driver 102, and communications link 104 to the microprocessor may thus also be used for programming purposes. According to the present invention, however, a second bus protocol is used for programming, in particular, a standard protocol of a serial interface such as RS232, etc.

As a result, the data for programming flash chips in a controller is sent via a fast driver for a standard CAN interface instead of via a slow driver for a standard serial ASC interface. However, the standard serial protocol, for example, may continue to be used. To make this possible, the processor may internally switch the lines of its serial ASC interface to the lines of the CAN interface. Another advantage of this arrangement may be that the CAN driver block, which is located outside the CPU, i.e., microprocessor 103, is provided in controller 100 and has no other functions to perform during controller programming, may be used for this purpose, thus avoiding the expense of additional hardware.

The processor pins, i.e., ATX and ARX, which lead to external CAN driver 102, are therefore optionally connected to the processor-internal ASC (108) or CAN (107) units. The data transmission rates thus achievable are many times higher than those of conventional serial interface drivers. Data rates of, for example, 1 Mbaud are therefore possible in normal CAN mode. This alone boosts the speed by a factor of 4. As a result, the CAN protocol may be used for programming as well. If the CAN protocol is not implemented via the CAN driver, but rather a normal serial protocol, and if short line lengths, i.e., line capacities, compared to the vehicle CAN network, are used for programming, much higher transmission rates are still also achievable, for example, up to 8 Mbaud, i.e., with different protocols for communication and programming. For example, the transmission time for 8 MB of data is thus reduced from 320 seconds to 10 seconds.

Shortening the transmission times in this example by a factor of 32 may reduce the outlay, i.e., time, cost, and number of programming stations, whenever larger numbers of controllers are programmed. The controllers may not have to be opened for programming, since the necessary connector pins remain accessible from the outside even when the housing is closed.

What is claimed is:

1. A device for programming a control unit connectable to an external programming unit via a communications interface, comprising:
   a monitoring unit including a programming element and a communications element;
   an internal communications link configured to connect the communications interface to the monitoring unit; and
   a switching arrangement configured to switch the communications link between the programming element and the communications element.

2. The device according to claim 1, wherein the communications link includes a single driver element arranged between the communications interface and the switching arrangement.

3. The device according to claim 1, wherein the communications link includes a CAN link having a CAN driver circuit connected between the communications interface and the monitoring unit in the communications link.

4. The device according to claim 1, further comprising:
   a first arrangement configured to transmit data via the communications link between the communications interface and the communications element in accordance with a first bus protocol; and
   a second arrangement configured to transmit data in accordance with a second bus protocol when the communications link switches to the programming element.

5. The device according to claim 4, wherein the first bus protocol includes a CAN protocol.

6. The device according to claim 1, wherein the switching arrangement, the programming element and the communications element are integrated into the monitoring unit.

7. The device according to claim 1, wherein the programming element and the communications element are integrated into the monitoring unit, the switching arrangement arranged outside the monitoring unit.

8. A switching arrangement, comprising:
   first terminals configured to connect to a communications link, the switching arrangement insertable into the communications link such that the first terminals are provided to connect to a communications interface;
   second terminals configured to connect to a communications element; and
   third terminals configured to connect to a programming element.

9. A method of programming a control unit, including a communications link, a programming element, and a communications element, comprising:
   transmitting data for communication with a first bus protocol to and from the communications element via the communications link; and
   transmitting data for programming via a second bus protocol over the same communications link; and
   switching from the communications element to the programming element.

* * * * *